(12) United States Patent
Kishino (10) Patent No.: US 11,984,528 B2
(45) Date of Patent: May 14, 2024

(54) METHOD OF MANUFACTURING NITRIDE SEMICONDUCTOR DEVICE

(71) Applicant: NICHIA CORPORATION, Anan (JP)

(72) Inventor: Toshihiko Kishino, Anan (JP)

(73) Assignee: NICHIA CORPORATION, Anan (JP)

(\*) Notice: Subject to any disclaimer, the term of this patent is extended or adjusted under 35 U.S.C. 154(b) by 435 days.

(21) Appl. No.: 17/210,001

(22) Filed: Mar. 23, 2021

(65) Prior Publication Data

US 2021/0305451 A1  Sep. 30, 2021

(30) Foreign Application Priority Data

Mar. 30, 2020  (JP) .................. 2020-059321

(51) Int. Cl.
H01L 33/00 (2010.01)

(52) U.S. Cl.
CPC ........ H01L 33/007 (2013.01); H01L 33/0025 (2013.01)

(58) Field of Classification Search
CPC .................................................. H01L 33/007
See application file for complete search history.

(56) References Cited

U.S. PATENT DOCUMENTS

| | | |
|---|---|---|
| 2007/0034853 A1 | 2/2007 | Robbins et al. |
| 2008/0116477 A1 | 5/2008 | Komada |
| 2008/0118999 A1 | 5/2008 | Komada |
| 2008/0217646 A1* | 9/2008 | Komada ............. H01L 33/04 257/101 |
| 2019/0207043 A1 | 7/2019 | Yonkee et al. |
| 2021/0074882 A1* | 3/2021 | Wang .................. H01L 33/06 |
| 2021/0234063 A1* | 7/2021 | Maros ............... H01L 33/0045 |

FOREIGN PATENT DOCUMENTS

| | | |
|---|---|---|
| JP | 2007-053376 A | 3/2007 |
| JP | 2008-130877 A | 6/2008 |
| JP | 2008-130878 A | 6/2008 |
| JP | 2008-141047 A | 6/2008 |
| JP | 2008-226906 A | 9/2008 |
| JP | 2011-040784 A | 2/2011 |
| JP | 2017-157667 A | 9/2017 |
| JP | 2018-022814 A | 2/2018 |

\* cited by examiner

*Primary Examiner* — Moazzam Hossain
*Assistant Examiner* — Hajar Kolahdouzan
(74) *Attorney, Agent, or Firm* — Foley & Lardner LLP (57) ABSTRACT

A method of manufacturing a nitride semiconductor device includes: forming, on or above a p-type nitride semiconductor tunnel junction layer, a first n-type nitride semiconductor layer that forms a tunnel junction with the p-type nitride semiconductor tunnel junction layer, the first n-type nitride semiconductor layer having a first impurity concentration and a first thickness; forming, on or above the first n-type nitride semiconductor layer, in a nitrogen atmosphere, a second n-type nitride semiconductor layer having a second n-type impurity concentration less than the first n-type impurity concentration and a second thickness; and forming, on or above the second n-type nitride semiconductor layer, in a hydrogen atmosphere, a third n-type nitride semiconductor layer having a third n-type impurity concentration less than the first n-type impurity concentration and a third thickness.

18 Claims, 9 Drawing Sheets

METHOD OF MANUFACTURING NITRIDE SEMICONDUCTOR DEVICE

CROSS-REFERENCE TO RELATED APPLICATION

This application is based upon and claims priority to Japanese Patent Application No. 2020-059321, filed on Mar. 30, 2020, the entire contents of which are incorporated herein by reference.

BACKGROUND

The present disclosure relates to a method of manufacturing a nitride semiconductor device.

Japanese Patent Publication Nos. 2017-157667 and 2008-130877 describe nitride semiconductor light emitting devices that include a tunnel junction layer. A tunnel junction layer includes a p-type semiconductor layer with a relatively high p-type impurity concentration and an n-type semiconductor layer with a relatively high n-type impurity concentration. In Japanese Patent Publication No. 2017-157667, as a part of a tunnel junction layer, an $n^{++}$-GaN layer having a Si concentration of $4\times10^{20}$ cm$^{-3}$ or more is formed using an $N_2$ carrier gas, then an n-GaN layer having a Si concentration of $8\times10^{18}$ cm$^{-3}$ is formed using a $H_2$ carrier gas, and subsequently an n-GaN contact layer is formed. In Japanese Patent Publication No. 2008-130877, an n-type $In_{0.25}Ga_{0.75}N$ tunnel junction layer having a Si concentration of $1\times10^{20}$ cm$^{-3}$ is formed using a nitrogen carrier gas, then an n-type GaN evaporation suppression layer having a Si concentration of $1\times10^{20}$ cm$^{-3}$ is formed, and then an n-type GaN layer having a Si concentration of $1\times10^{19}$ cm$^{-3}$ is formed using a hydrogen carrier gas.

SUMMARY

One object of the present disclosure is to provide a nitride semiconductor device with enhanced reliability.

According to one aspect of the present disclosure, a method of manufacturing a nitride semiconductor device includes: forming, on or above a p-type nitride semiconductor tunnel junction layer, a first n-type nitride semiconductor layer that forms a tunnel junction with the p-type nitride semiconductor tunnel junction layer, first n-type nitride semiconductor layer having a first impurity concentration and a first thickness; forming, on or above the first n-type nitride semiconductor layer, in a nitrogen atmosphere, a second n-type nitride semiconductor layer having a second n-type impurity concentration less than the first n-type impurity concentration and a second thickness; and forming, on or above the second n-type nitride semiconductor layer, in a hydrogen atmosphere, a third n-type nitride semiconductor layer having a third n-type impurity concentration less than the first n-type impurity concentration and a third thickness.

According to certain embodiments of the manufacturing method of the present disclosure, a nitride semiconductor device with enhanced reliability can be obtained.

DETAILED DESCRIPTION

Hereinafter, embodiments of the present disclosure will be described with reference to the drawings. It should be noted that in each drawing, the same elements are denoted by the same reference numerals.

Figure 1:
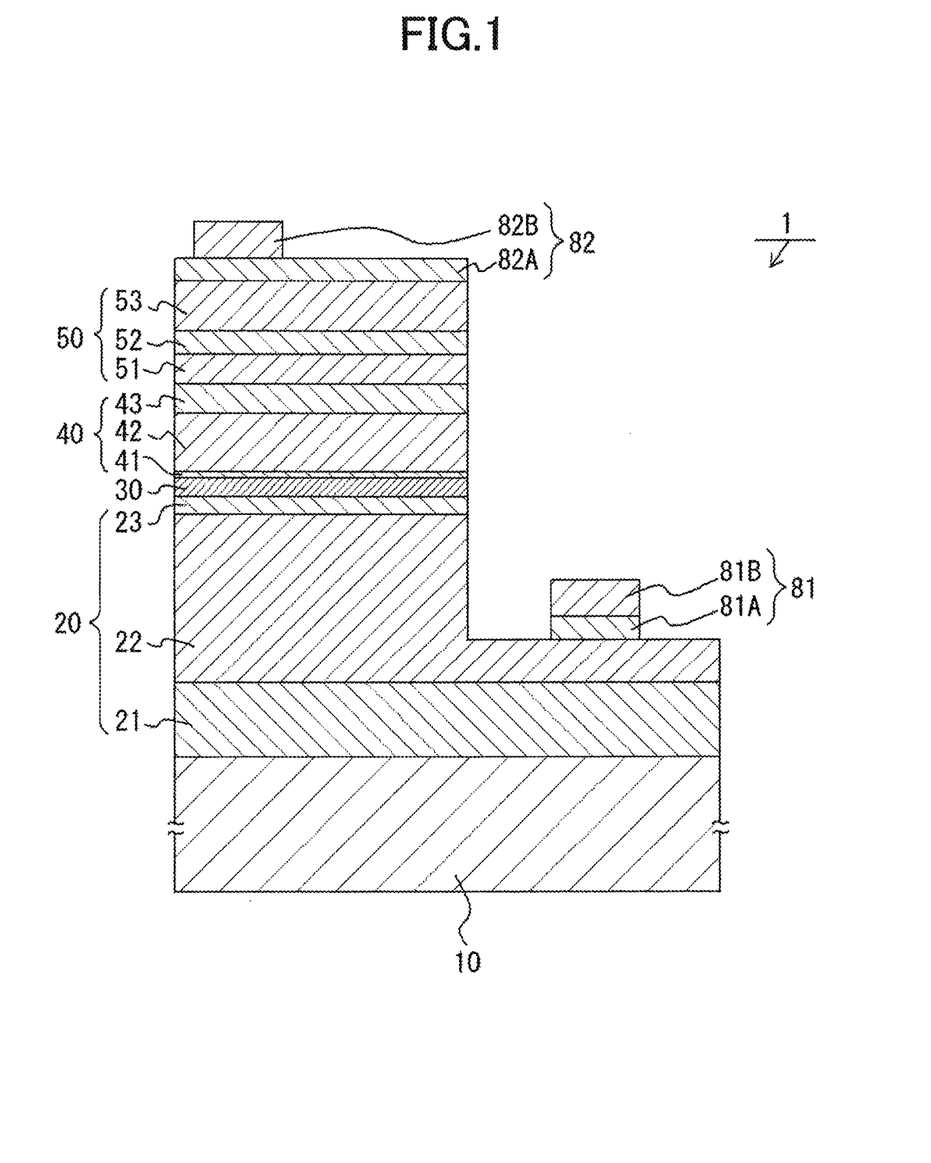
FIG. 1 is a schematic cross-sectional view of a nitride semiconductor device according to an embodiment of the present disclosure.

FIG. 1 is a schematic cross-sectional view of a nitride semiconductor device 1 according to an embodiment of the present disclosure. The nitride semiconductor device 1 illustrated in FIG. 1 is a light emitting device. The nitride semiconductor device 1 of the present embodiment includes a p-type nitride semiconductor tunnel junction layer 43, a first n-type nitride semiconductor layer 51, a second n-type nitride semiconductor layer 52, and a third n-type nitride semiconductor layer 53. The nitride semiconductor device 1 can include a substrate 10, a first layered portion 20, a light emitting layer 30, a second layered portion 40, a third layered portion 50, an n-side electrode 81, and a p-side electrode 82.

Examples of the material of the substrate 10 include sapphire, silicon, SiC, GaN, and the like. A buffer layer may be provided between the substrate 10 and the first layered portion 20.

A semiconductor layered body is a layered body in which a plurality of semiconductor layers made of nitride semiconductors are layered, and includes the first layered portion 20, the light emitting layer 30, the second layered portion 40, and the third layered portion 50. A nitride semiconductor may include a semiconductor having any composition obtained by changing the composition ratio of x and y in a chemical formula of $In_xAl_yGa_{1-x-y}N$ ($0\leq x\leq 1$, $0\leq y\leq 1$, $x+y\leq 1$) within their respective ranges. In the semiconductor layered body, the first layered portion 20, the light emitting layer 30, the second layered portion 40, and the third layered portion 50 are arranged in this order from the side of the substrate 10.

The first layered portion 20 includes one or more n-type nitride semiconductor layers. An n-type nitride semiconductor layer may be a layer made of a nitride semiconductor containing an n-type impurity such as silicon (Si) or germanium (Ge). A nitride semiconductor constituting the n-type nitride semiconductor layer may be, for example, GaN and may include indium (In) and/or aluminum (Al). For example, the n-type impurity concentration (Si concentration) of the n-type nitride semiconductor layer containing Si as an n-type impurity is $1\times10^{18}/cm^3$ or more and $1\times10^{20}/cm^3$ or less. The first layered portion 20 may include an undoped layer. The undoped layer is a layer in which an n-type impurity and a p-type impurity are intentionally not doped. The concentrations of an n-type impurity and a p-type impurity in the undoped layer are, for example, are concentrations not exceeding the detection limit in a result of analysis such as secondary ion mass spectrometry (SIMS). In a case in which an undoped layer is adjacent to a layer intentionally doped with an n-type impurity and/or a p-type impurity, the undoped layer may contain an n-type impurity and/or a p-type impurity due to diffusion from the adjacent layer or the like.

The first layered portion 20 can include, for example, a GaN layer 21, an n-type GaN layer 22, and a multilayer film 23. The GaN layer 21 is an undoped layer. The thickness of the GaN layer 21 can be 2 μm or more and 5 μm or less. The GaN layer 21 may be omitted. The n-type GaN layer 22 includes Si as an n-type impurity. The n-type impurity concentration of the n-type GaN layer 22 can be $1\times10^{18}/cm^3$ or more and $1\times10^{19}/cm^3$ or less. The thickness of the n-type GaN layer 22 can be 3 μm or more and 7 μm or less. The multilayer film 23 is a film in which a plurality of pairs of an undoped GaN layer and an undoped InGaN layer are layered. The total thickness of the multilayer film 23 can be 30 nm or more and 300 nm or less.

The light emitting layer 30 is provided between the first layered portion 20 and the second layered portion 40. For example, the light emitting layer 30 has a multi-quantum well structure including a plurality of well layers and a plurality of barrier layers. For the plurality of well layers, InGaN is used, for example. For the plurality of barrier layers, GaN is used, for example. The light emitting layer 30 may be an undoped layer in its entirety or at least a portion thereof may contain an n-type impurity and/or a p-type impurity. The light emitted by the light emitting layer 30 may be ultraviolet light or visible light. The light emitting layer 30 can emit, for example, blue light (peak wavelength of 430 nm or more and 490 nm or less).

The second layered portion 40 includes one or more p-type nitride semiconductor layers. A p-type nitride semiconductor layer may be a layer made of a nitride semiconductor containing a p-type impurity such as magnesium (Mg). A nitride semiconductor constituting the p-type nitride semiconductor layer may be, for example, GaN and may include In and/or Al. For example, the p-type impurity concentration (Mg concentration) of the p-type nitride semiconductor layer containing Mg as a p-type impurity is $5\times10^{19}/cm^3$ or more and $5\times10^{20}/cm^3$ or less. The second layered portion 40 may include an undoped layer.

The second layered portion 40 can include, for example, a p-type AlGaN layer 41, a GaN layer 42, and a p-type nitride semiconductor tunnel junction layer 43. The p-type AlGaN layer 41 includes Mg as a p-type impurity. The p-type impurity concentration of the p-type AlGaN layer 41 can be $5\times10^{19}/cm^3$ or more and $5\times10^{20}/cm^3$ or less. The thickness of the p-type AlGaN layer 41 can be 2 nm or more and 20 nm or less. The GaN layer 42 is an undoped layer. The thickness of the GaN layer 42 can be 20 nm or more and 200 nm or less. By providing, between the p-type nitride semiconductor tunnel junction layer 43 and the p-type nitride semiconductor layer below the p-type nitride semiconductor tunnel junction layer 43, a high resistance layer, such as the GaN layer 42, of which the resistance is higher than that of the p-type nitride semiconductor tunnel junction layer 43 and that of the p-type nitride semiconductor layer, the diffusion of current in the direction intersecting the layered direction of the second layered portion 40 (horizontal direction in FIG. 1) can be promoted. The thickness of a high resistance layer, such as the GaN layer 42, can be made greater than the thickness of the p-type nitride semiconductor tunnel junction layer 43.

The p-type nitride semiconductor tunnel junction layer 43 includes a p-type impurity. The p-type nitride semiconductor tunnel junction layer 43 is, for example, a p-type GaN layer containing Mg as a p-type impurity. The p-type impurity concentration and the thickness of the p-type nitride semiconductor tunnel junction layer 43 are set to be able to form a tunnel junction with the first n-type nitride semiconductor layer 51, as will be described later below.

The third layered portion 50 includes a first n-type nitride semiconductor layer 51, a second n-type nitride semiconductor layer 52, and a third n-type nitride semiconductor layer 53. These n-type nitride semiconductor layers may be layers made of a nitride semiconductor containing n-type impurities such as Si or Ge. A nitride semiconductor constituting these n-type nitride semiconductor layers may be, for example, GaN and may include In and/or Al.

An n-type nitride semiconductor layer included in the first layered portion 20 has an n-contact surface on which no additional semiconductor layer is provided. An n-side electrode 81 is provided on the surface of the n-contact surface. The n-side electrode 81 is electrically connected to the n-type nitride semiconductor layers included in the first layered portion 20. The p-side electrode 82 is provided on the surface of the third layered portion 50. The p-side electrode 82 is electrically connected to the third n-type nitride semiconductor layer 53 of the third layered portion 50. That is, the n-side electrode 81 is electrically connected to a semiconductor layer located on one side of the light emitting layer 30, and the p-side electrode 82 is electrically connected to a semiconductor layer located on the other side of light emitting layer 30.

A forward voltage is applied between the p-side electrode 82 and the n-side electrode 81. At this time, by applying the forward voltage between the p-type nitride semiconductor layers of the second layered portion 40 and the n-type nitride semiconductor layers of the first layered portion 20, and by supplying electrons to the light emitting layer 30, the light emitting layer 30 emits light.

When a positive potential is applied to the p-side electrode 82 and a lower potential (e.g., negative potential) than the p-side electrode 82 is applied to the n-side electrode 81, a reverse voltage is applied between the p-type nitride semiconductor tunnel junction layer 43 and the first n-type nitride semiconductor layer 51. Therefore, a current between the p-type nitride semiconductor tunnel junction layer 43 and the first n-type nitride semiconductor layer 51 uses a tunneling effect. That is, by tunneling electrons present in the valence band of the p-type nitride semiconductor tunnel junction layer 43 to the conduction band of the first n-type nitride semiconductor layer 51, a current is caused to flow.

In order to obtain such a tunneling effect, a pn junction is formed by the p-type nitride semiconductor tunnel junction layer 43 doped with a p-type impurity at a high concentration and the first n-type nitride semiconductor layer 51 doped with an n-type impurity at a high concentration. As the concentration of each conductive impurity contained in the first n-type nitride semiconductor layer 51 and the p-type nitride semiconductor tunnel junction layer 43 increases, the width of a depletion layer formed at the interface between the p-type nitride semiconductor tunnel junction layer 43 and the first n-type nitride semiconductor layer 51 can be made narrower. Then, as the width of the depletion layer becomes narrower, when a voltage is applied, electrons in the valence band of the p-type nitride semiconductor tunnel junction layer 43 easily tunnel the depletion layer and move to the conduction band of the first n-type nitride semiconductor layer 51.

For example, the Si concentration of the first n-type nitride semiconductor layer 51 including Si as an n-type impurity is $5 \times 10^{19}/cm^3$ or more and $2 \times 10^{21}/cm^3$ or less. For example, the Mg concentration of the p-type nitride semiconductor tunnel junction layer 43 including Mg as a p-type impurity is $1 \times 10^{20}/cm^3$ or more and $5 \times 10^{21}/cm^3$ or less. For example, the width of the depletion layer formed by the p-type nitride semiconductor tunnel junction layer 43 and the first n-type nitride semiconductor layer 51 is 5 nm or more and 8 nm or less.

Figure 2:
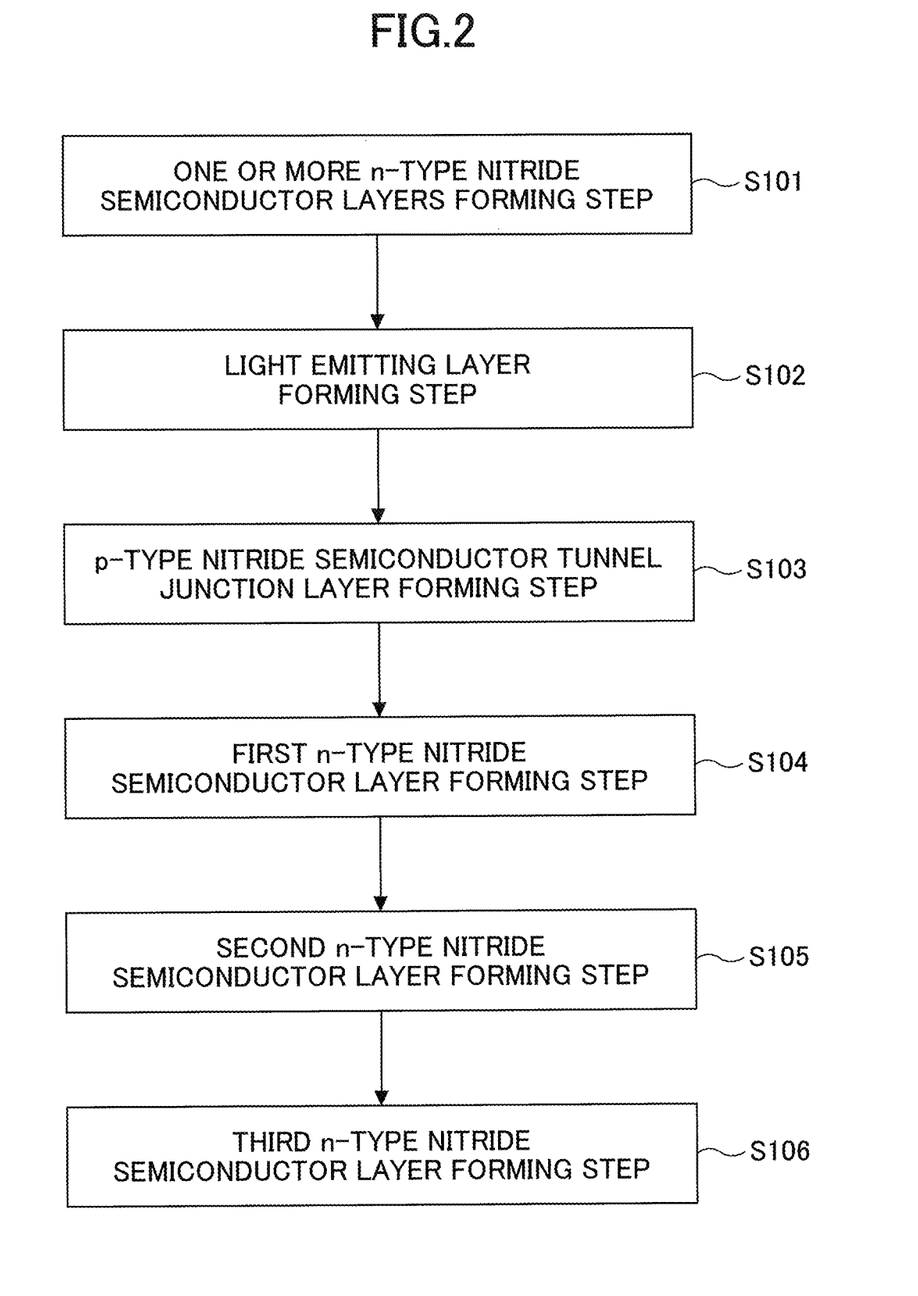
FIG. 2 is a flowchart illustrating a method of manufacturing a nitride semiconductor device according to an embodiment of the present disclosure.

FIG. 2 is a flowchart illustrating a method of manufacturing a nitride semiconductor device according to the present embodiment. As illustrated in FIG. 2, a method of manufacturing a nitride semiconductor device according to the present embodiment includes a p-type nitride semiconductor tunnel junction layer forming step S103, a first n-type nitride semiconductor layer forming step S104, a second n-type nitride semiconductor layer forming step S105, and a third n-type nitride semiconductor layer forming step S106. The method of manufacturing a nitride semiconductor device can further include, prior to step S103, a one or more n-type nitride semiconductor layers forming step S101 and a light emitting layer forming step S102. FIG. 3A to FIG. 3F are schematic cross-sectional views illustrating a method of manufacturing a nitride semiconductor device 1 according to the present embodiment.

Each of the aforementioned nitride semiconductor layers contained in the nitride semiconductor device 1 is epitaxially grown over the substrate 10 by a metal organic chemical vapor deposition (MOCVD) method in a furnace where the pressure and the temperature can be adjusted. Each nitride semiconductor layer can be formed by introducing a carrier gas and a raw material gas into a furnace. As the carrier gas, a hydrogen ($H_2$) gas or a nitrogen ($N_2$) gas can be used. As a raw material gas of N source, an ammonia ($NH_3$) gas can be used. As a raw material gas of Ga source, a trimethylgallium (TMG) gas or a triethylgallium (TEG) gas can be used. As a raw material gas of In source, a trimethylindium (TMI) gas can be used. As a raw material gas of Al source, a trimethylaluminum (TMA) gas can be used. As a raw material gas of Si source, a monosilane ($SiH_4$) gas can be used. As a raw material gas of Mg source, a biscyclopentadienylmagnesium ($Cp_2Mg$) can be used.

Figure 3A:
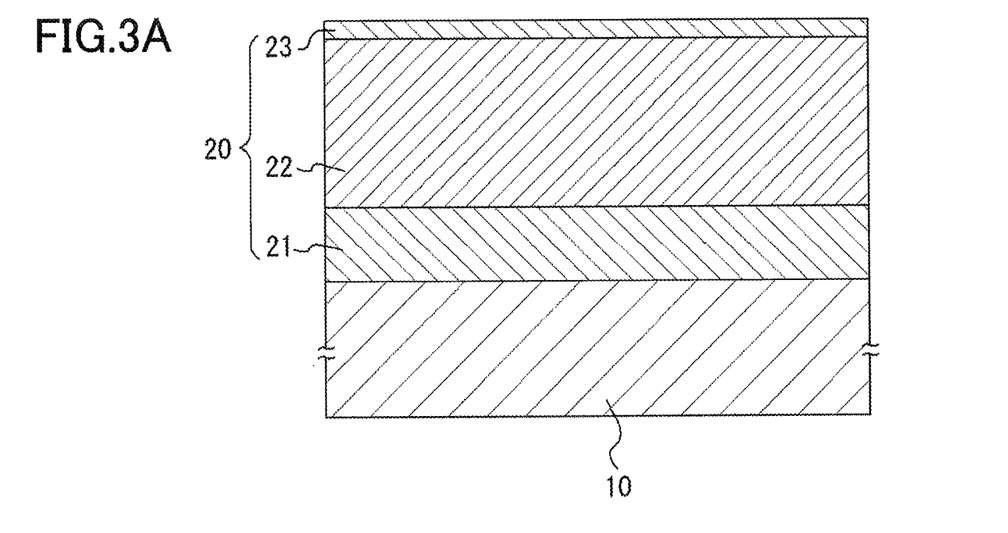
FIG. 3A is a schematic cross-sectional view illustrating the method of manufacturing a nitride semiconductor device according to the embodiment of the present disclosure.

First, one or more n-type nitride semiconductor layers are formed on or above the substrate 10 (step S101). As illustrated in FIG. 3A, a first layered portion 20 having one or more n-type nitride semiconductor layers can be formed. As the first layered portion 20, a GaN layer 21, an n-type GaN layer 22, and a multilayer film 23 are layered in this order.

Before forming the GaN layer 21 over the substrate 10, a buffer layer may be formed on the surface of the substrate 10.

Figure 3B:
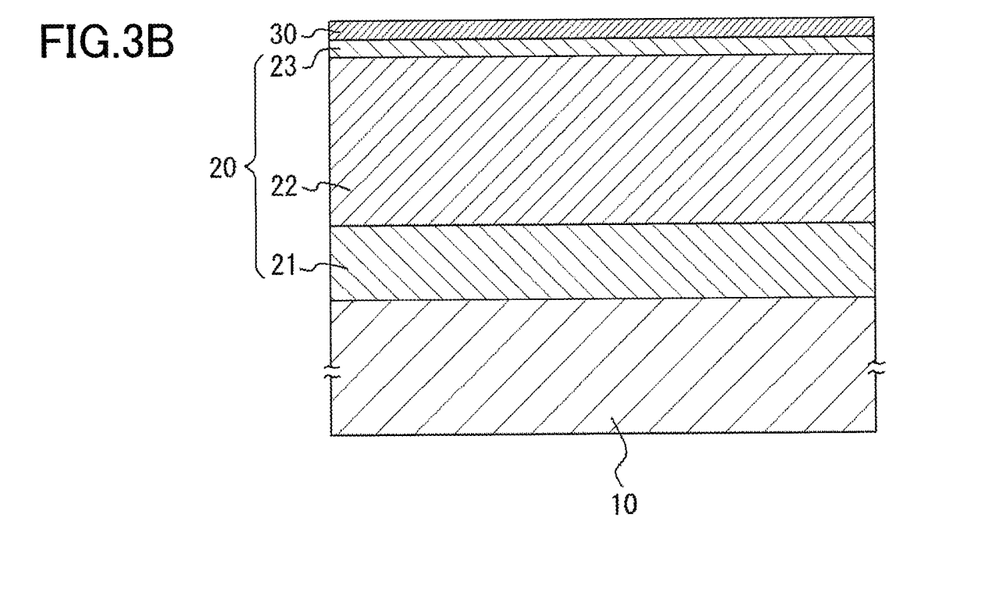
FIG. 3B is a schematic cross-sectional view illustrating the method of manufacturing a nitride semiconductor device according to the embodiment of the present disclosure.

Next, as illustrated in FIG. 3B, a light emitting layer 30 is formed on or above one or more n-type nitride semiconductor layers (step S102).

Figure 3C:
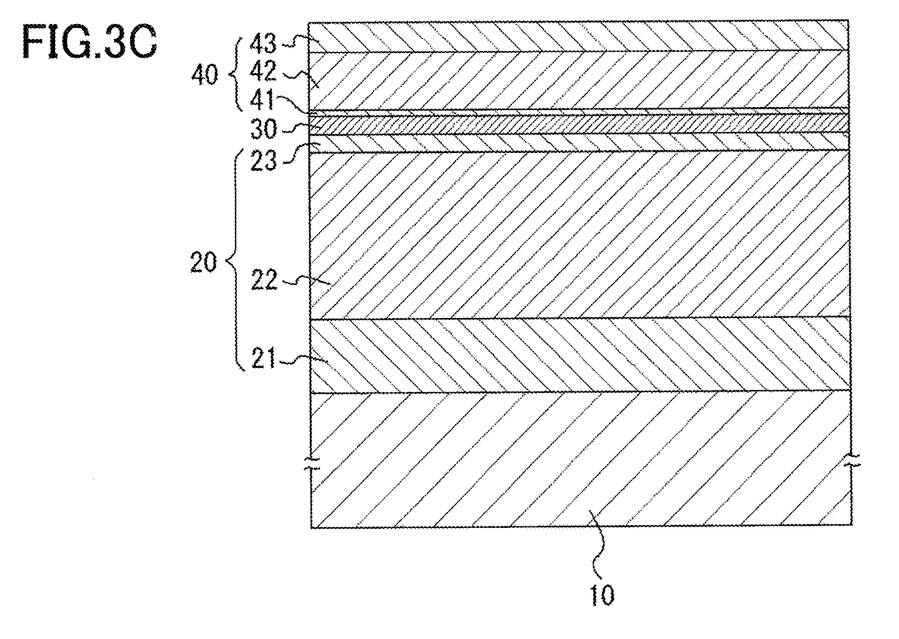
FIG. 3C is a schematic cross-sectional view illustrating the method of manufacturing a nitride semiconductor device according to the embodiment of the present disclosure.

Next, a p-type nitride semiconductor tunnel junction layer 43 is formed or above the light emitting layer 30 (step S103). As illustrated in FIG. 3C, a second layered portion 40 including the p-type nitride semiconductor tunnel junction layer 43 can be formed on the light emitting layer 30. A p-type AlGaN layer 41, a GaN layer 42, and the p-type nitride semiconductor tunnel junction layer 43 are layered in this order as the second layered portion 40. As the p-type nitride semiconductor tunnel junction layer 43, for example, a GaN layer in which Mg is doped at a concentration of $2 \times 10^{20}/cm^3$ is formed with a thickness of 20 nm.

The p-type impurity concentration and the thickness of the p-type nitride semiconductor tunnel junction layer 43 are set to be able to form a tunnel junction with the first n-type nitride semiconductor layer 51, which will be described later below. The p-type impurity concentration of the p-type nitride semiconductor tunnel junction layer 43 can be $5 \times 10^{19}/cm^3$ or more and $1 \times 10^{21}/cm^3$ or less. The p-type impurity concentration of the p-type nitride semiconductor tunnel junction layer 43 can be higher than the p-type impurity concentration of every layer between the light emitting layer 30 and the p-type nitride semiconductor tunnel junction layer 43. The thickness of the p-type nitride semiconductor tunnel junction layer 43 can be 2 nm or more and 30 nm or less. A nitride semiconductor constituting the p-type nitride semiconductor tunnel junction layer 43 may be, for example, GaN, InGaN, or AlGaN. The nitride semiconductor constituting the p-type nitride semiconductor tunnel junction layer 43 can be, for example, GaN.

The temperature in the step of forming each nitride semiconductor layer after the step of forming the light emitting layer 30 is preferably relatively low, in consideration of the effect on the light emitting layer 30. In a case in which the light emitting layer 30 includes an InGaN layer, the temperature in the subsequent step of forming each nitride semiconductor layer is preferably less than 1000° C., is more preferably less than or equal to 950° C., and may be greater than or equal to 800° C. The temperature in the step of forming each nitride semiconductor layer can be the temperature of the substrate 10. After forming the p-type nitride semiconductor tunnel junction layer 43, the wafer composed of the substrate 10 and each semiconductor layer may be temporarily taken out from the furnace. After cleaning the wafer taken out from the furnace, the wafer may be returned into the reactor of the furnace.

Figure 3D:
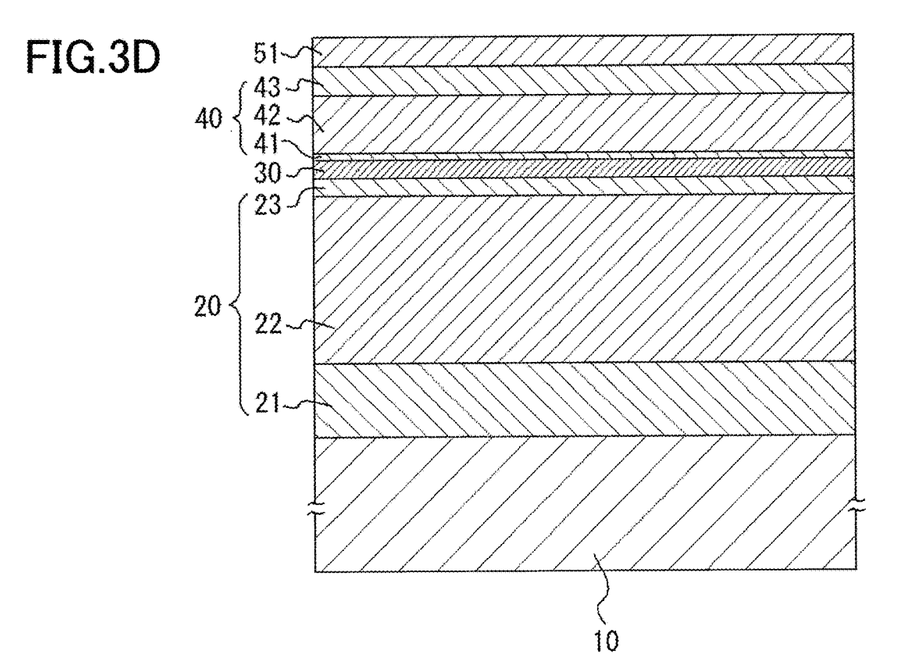
FIG. 3D is a schematic cross-sectional view illustrating the method of manufacturing a nitride semiconductor device according to the embodiment of the present disclosure.

Next, as illustrated in FIG. 3D, a first n-type nitride semiconductor layer 51 is formed on or above the p-type nitride semiconductor tunnel junction layer 43 (step S104). The first n-type nitride semiconductor layer 51 forms a tunnel junction with the p-type nitride semiconductor tunnel junction layer 43. The first n-type nitride semiconductor layer 51 has a first n-type impurity concentration and a first thickness. The first n-type nitride semiconductor layer 51 can be formed in contact with the p-type nitride semiconductor tunnel junction layer 43.

The first n-type nitride semiconductor layer 51 is formed by introducing a carrier gas and a raw material gas into a furnace. As the carrier gas, a nitrogen gas or a hydrogen gas can be used. The temperature in the step of forming the first n-type nitride semiconductor layer 51 is preferably less than 1000° C., is more preferably less than or equal to 950° C., and may be 800° C. or more. As the first n-type nitride semiconductor layer 51, for example, a GaN layer doped with Si at a concentration of $1\times10^{20}$/cm$^3$ is formed with a thickness of 30 nm.

The first n-type impurity concentration and the first thickness of the first n-type nitride semiconductor layer 51 are set to be able to form a tunnel junction with the p-type nitride semiconductor tunnel junction layer 43. For example, the tunnel junction can be made possible by the first n-type impurity concentration and the thickness described below. The first n-type impurity concentration can be higher than the second n-type impurity concentration of the second n-type nitride semiconductor layer 52 and can be higher than the third n-type impurity concentration of the third n-type nitride semiconductor layer 53. The first n-type impurity concentration can be $1\times10^{19}$/cm$^3$ or more. The first n-type impurity concentration can be $2\times10^{21}$/cm$^3$ or less. For example, the Si concentration of the first n-type nitride semiconductor layer 51 including Si as an n-type impurity is $5\times10^{19}$/cm$^3$ or more and $2\times10^{21}$/cm$^3$ or less. The first thickness can be 2 nm or more and 30 nm or less.

The nitride semiconductor constituting the first n-type nitride semiconductor layer 51 is, for example, GaN, InGaN, or AlGaN. The nitride semiconductor constituting the first n-type nitride semiconductor layer 51 can be GaN or AlGaN. Thereby, the absorption of light from the light emitting layer 30 can be reduced in comparison to a case where the nitride semiconductor constituting the first n-type nitride semiconductor layer 51 is InGaN. The nitride semiconductor constituting the first n-type nitride semiconductor layer 51 may be GaN. Because the first n-type nitride semiconductor layer 51 contains an n-type impurity at a relatively high concentration, there is concern about deterioration in the crystallinity, but the degree of deterioration in the crystallinity can be reduced with GaN.

Figure 3E:
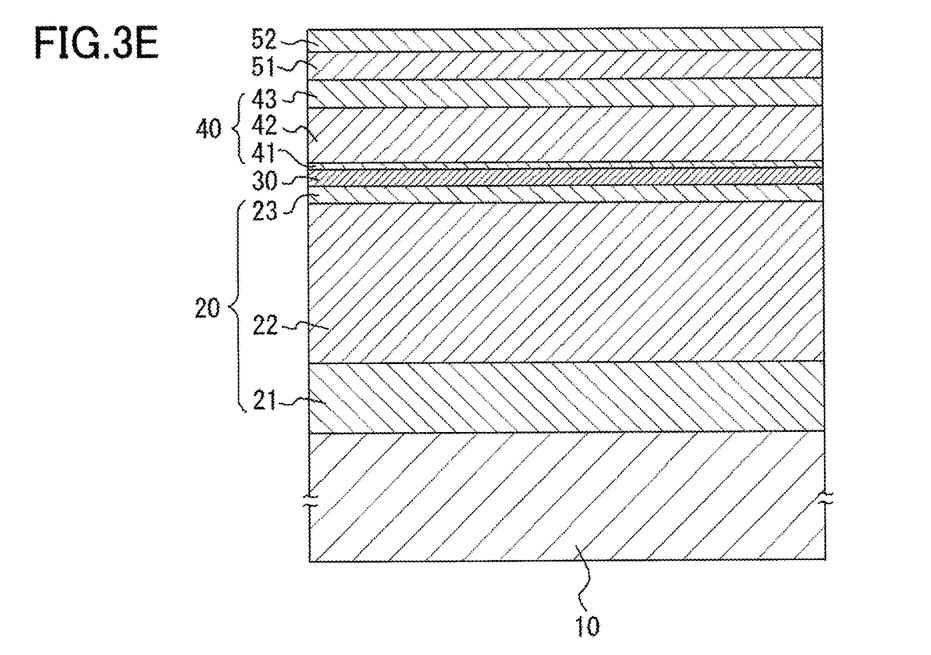
FIG. 3E is a schematic cross-sectional view illustrating the method of manufacturing a nitride semiconductor device according to the embodiment of the present disclosure.

Next, as illustrated in FIG. 3E, a second n-type nitride semiconductor layer 52 is formed on or above the first n-type nitride semiconductor layer 51 (step S105). The second n-type nitride semiconductor layer 52 has a second n-type impurity concentration and a second thickness.

The second n-type nitride semiconductor layer 52 is formed by introducing a carrier gas and a raw material gas into a furnace. The second n-type nitride semiconductor layer 52 is formed in a nitrogen atmosphere. The term "nitrogen atmosphere" in the present disclosure refers to a concentration of $N_2$, in the gas introduced into the furnace, being greater than or equal to 99.9% by volume. Also, as will be described later, when $H_2$ is present, because the lateral growth of nitride semiconductor is promoted, it is preferable that the concentration of $H_2$ in the gas introduced into the furnace is less than or equal to 0.01% by volume. For example, by using a nitrogen gas as the carrier gas, it is possible to make the nitrogen atmosphere in the furnace. The temperature in the step of forming the second n-type nitride semiconductor layer 52 is preferably less than 1000° C., is more preferably 950° C. or less, and can be 800° C. or more. It is preferable that the temperature in the step of forming the second n-type nitride semiconductor layer 52 is equal to or less than the temperature in the step of forming the first n-type nitride semiconductor layer 51. This is because the second n-type impurity concentration is less than the first n-type impurity concentration. The higher the impurity concentration, the worse the crystallinity and the surface morphology, whereas the higher the temperature at the time of formation, the better the crystallinity and the morphology. Thus, the second n-type nitride semiconductor layer 52 may be grown at a lower temperature than the first n-type nitride semiconductor layer 51, thereby reducing the possibility of deterioration in the characteristics of the light emitting layer 30. The temperature may be gradually increased from the step of forming the first n-type nitride semiconductor layer 51 to the step of forming the third n-type nitride semiconductor layer 53 that will be described later. As the second n-type nitride semiconductor layer 52, for example, a GaN layer doped with Si at a concentration of $5\times10^{18}$/cm$^3$ is formed with a thickness of 20 nm.

The second n-type impurity concentration of the second n-type nitride semiconductor layer 52 is less than the first n-type impurity concentration of the first n-type nitride semiconductor layer 51. Thus, the crystallinity of the second n-type nitride semiconductor layer 52 can be enhanced, and the flatness of the third n-type nitride semiconductor layer 53 to be subsequently grown can be enhanced. The second n-type impurity concentration can be $1\times10^{18}$/cm$^3$ or more. By intentionally doping an n-type impurity to the second n-type nitride semiconductor layer 52, the resistance of the second n-type nitride semiconductor layer 52 can be reduced and therefore the drive voltage of the obtained nitride semiconductor device 1 can be reduced. The second n-type impurity concentration can be less than the first n-type impurity concentration and can be less than or equal to $1\times10^{20}$/cm$^3$. For example, the Si concentration of the second n-type nitride semiconductor layer 52 including Si as an n-type impurity is $1\times10^{18}$/cm$^3$ or more and $1\times10^{20}$/cm$^3$ or less. The second thickness may be less than the first thickness. The second thickness can be 10 nm or more and may be 40 nm or less.

The nitride semiconductor constituting the second n-type nitride semiconductor layer 52 is, for example, GaN, InGaN, or AlGaN. The nitride semiconductor constituting the second n-type nitride semiconductor layer 52 is preferably GaN or AlGaN, and is more preferably GaN. With the second n-type nitride semiconductor layer 52 being an n-type GaN layer, the crystallinity of the third n-type nitride semiconductor layer 53 to be subsequently formed can be enhanced.

Figure 3F:
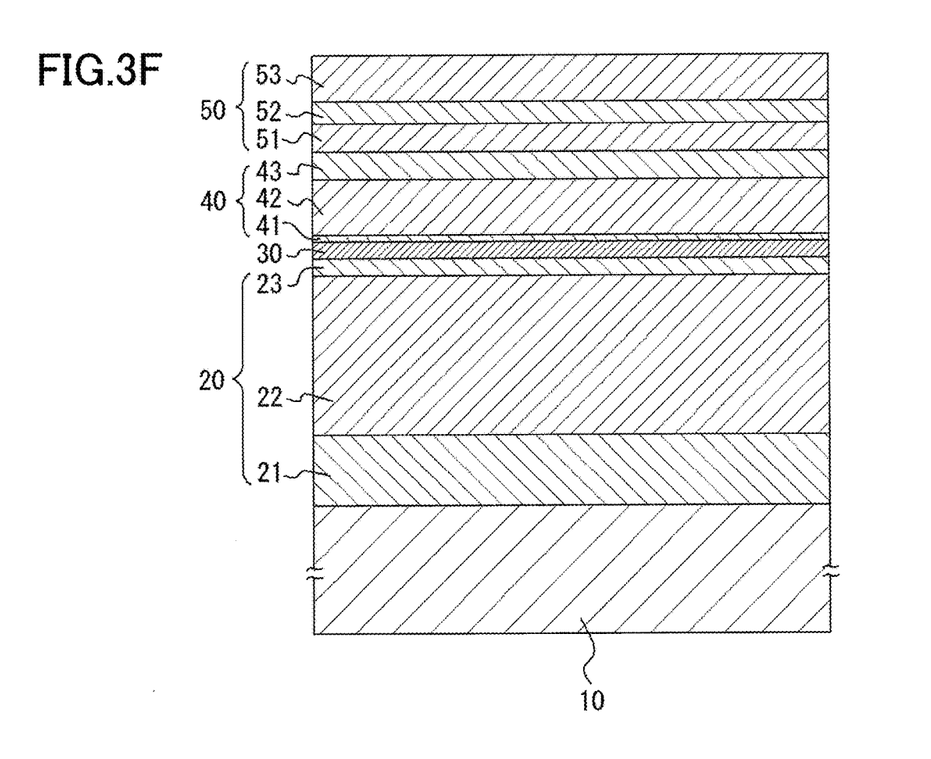
FIG. 3F is a schematic cross-sectional view illustrating the method of manufacturing a nitride semiconductor device according to the embodiment of the present disclosure.

Next, as illustrated in FIG. 3F, a third n-type nitride semiconductor layer 53 is formed on or above the second n-type nitride semiconductor layer 52 (step S106). The third n-type nitride semiconductor layer 53 has a third n-type impurity concentration and a third thickness. The first n-type nitride semiconductor layer 51, the second n-type nitride semiconductor layer 52, and the third n-type nitride semiconductor layer 53 can be formed continuously.

The third n-type nitride semiconductor layer 53 is formed by introducing a carrier gas and a raw material gas into a furnace. The third n-type nitride semiconductor layer 53 is formed in a hydrogen atmosphere. The term "hydrogen atmosphere" in the present disclosure refers to a concentration of $H_2$, in the gas introduced into the furnace, being 60% by volume or more. For example, by using a hydrogen gas as the carrier gas, it is possible to make the hydrogen atmosphere in the furnace. The temperature in the step of forming the third n-type nitride semiconductor layer 53 is preferably less than 1000° C., is more preferably 950° C. or less, and can be 800° C. or more. It is preferable that the temperature in the step of forming the third n-type nitride semiconductor layer 53 is equal to or less than the temperature in the step of forming the first n-type nitride semiconductor layer 51. Thereby, the possibility of deterioration of the characteristics of the light emitting layer 30 can be reduced. The temperature in the step of forming the third n-type nitride semiconductor layer 53 can be equal to or greater than the temperature in the step of forming the second n-type nitride semiconductor layer 52. As the third n-type nitride semiconductor layer 53, for example, a GaN layer doped with Si at a concentration of $5\times10^{18}/cm^3$ is formed with a thickness of 80 nm.

The third n-type impurity concentration of the third n-type nitride semiconductor layer 53 is less than the first n-type impurity concentration of the first n-type nitride semiconductor layer 51. Thereby, it is possible to enhance the flatness of the third n-type nitride semiconductor layer 53. By intentionally doping an n-type impurity to the third n-type nitride semiconductor layer 53, the resistance of the third n-type nitride semiconductor layer 53 can be reduced and therefore the drive voltage of the obtained nitride semiconductor device 1 can be reduced. The third n-type impurity concentration can be $1\times10^{18}/cm^3$ or more. The third n-type impurity concentration can be less than the first n-type impurity concentration and can be $1\times10^{20}/cm^3$ or less. For example, the Si concentration of the third n-type nitride semiconductor layer 53 including Si as an n-type impurity is $1\times10^{18}/cm^3$ or more and $1\times10^{20}/cm^3$ or less.

The third thickness can be 10 nm or more and 500 nm or less. The third thickness of the third n-type nitride semiconductor layer 53 may be greater than the second thickness of the second n-type nitride semiconductor layer 52. Thereby, it is possible to enhance the flatness of the third n-type nitride semiconductor layer 53. For similar reasons, the third thickness may be greater than the first thickness.

The nitride semiconductor constituting the third n-type nitride semiconductor layer 53 is, for example, GaN, InGaN, or AlGaN. The nitride semiconductor constituting the third n-type nitride semiconductor layer 53 is preferably GaN or AlGaN, and is more preferably GaN. By the third n-type nitride semiconductor layer 53 being an n-type GaN layer, the crystallinity can be enhanced.

A portion of the semiconductor layered body is then removed to expose a portion of the first layered portion 20. Then, as illustrated in FIG. 1, the p-side electrode 82 is formed on the third layered portion 50, and the n-side electrode 81 is formed on the exposed surface of the first layered portion 20. As the n-side electrode 81 and the p-side electrode 82, translucent electrodes 81A and 82A such as ITO electrodes can be formed first, and then metal electrodes 81B and 82B can be formed. Thereby, the nitride semiconductor device 1 illustrated in FIG. 1 can be obtained.

Figure 4:
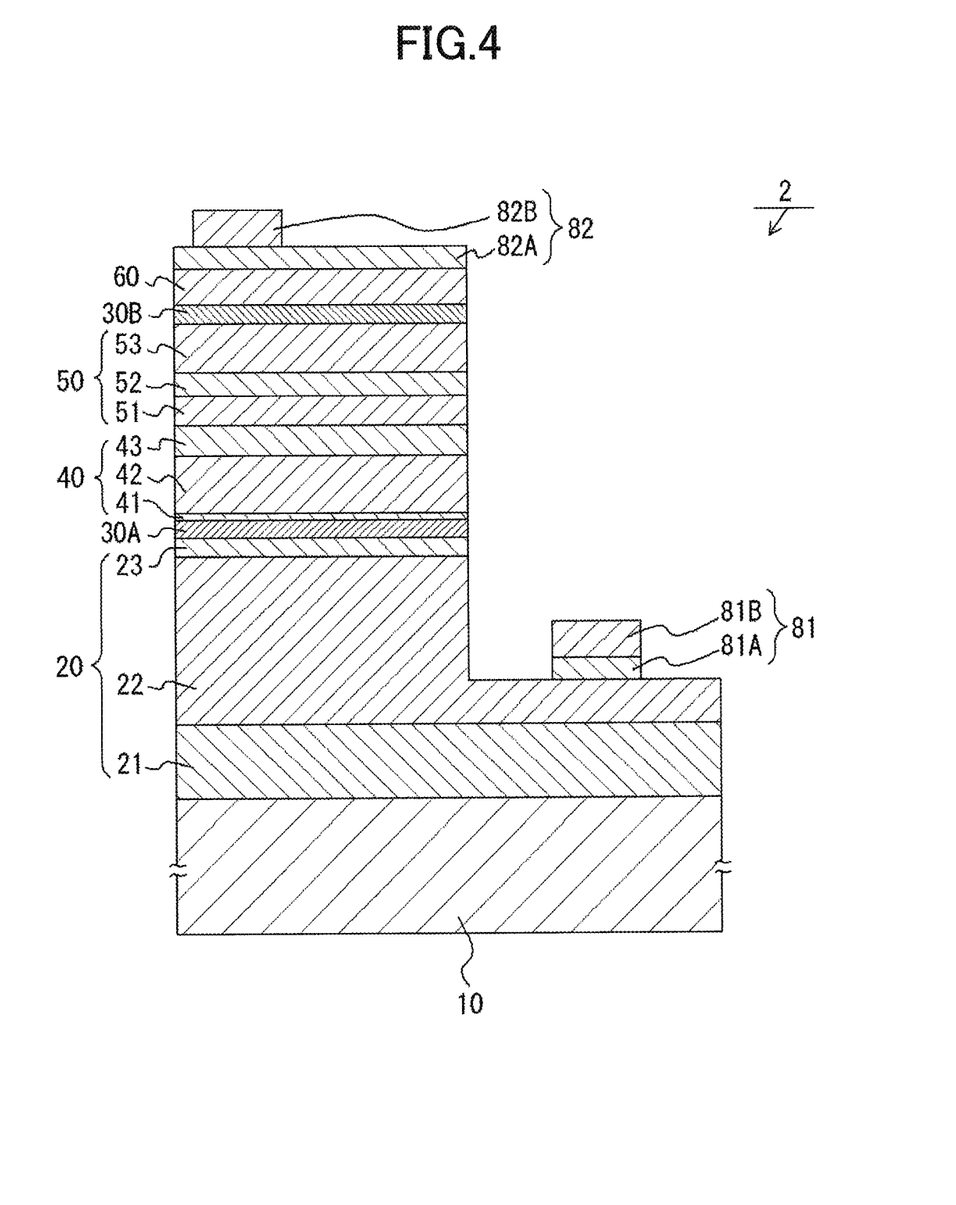
FIG. 4 is a schematic cross-sectional view of a nitride semiconductor device according to a modified example of the present disclosure.
Figure 5:
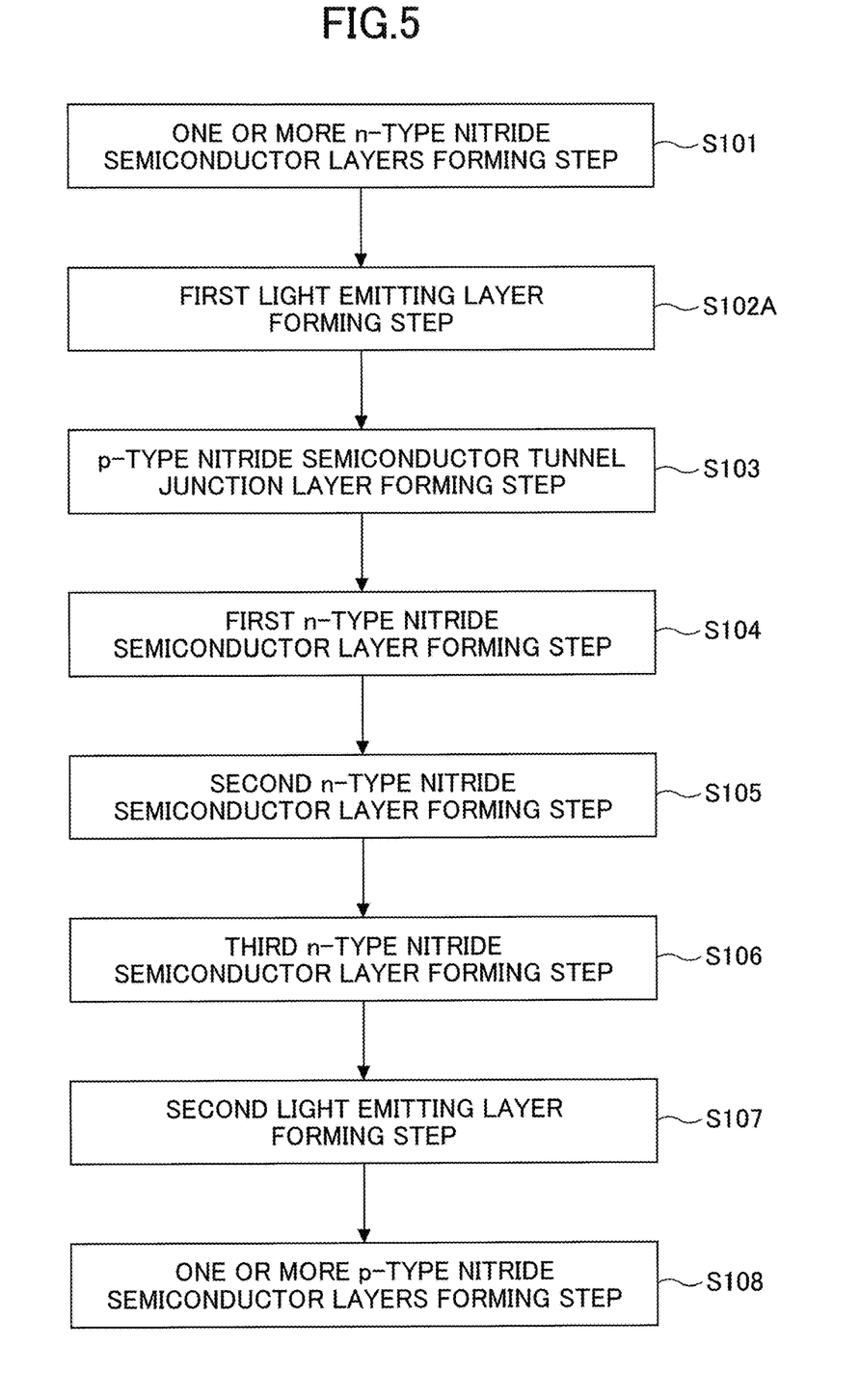
FIG. 5 is a flowchart illustrating a method of manufacturing a nitride semiconductor device according to the modified example of the present disclosure.

Another semiconductor layer may be further formed on the third n-type nitride semiconductor layer 53. FIG. 4 is a schematic cross-sectional view of a nitride semiconductor device 2 according to a modified example. FIG. 5 is a flowchart illustrating a method of manufacturing the nitride semiconductor device 2 according to the modified example. As illustrated in FIG. 4, the nitride semiconductor device 2 includes a first light 217, emitting layer 30A and a second light emitting layer 30B. The p-type nitride semiconductor tunnel junction layer 43 and the first n-type nitride semiconductor layer 51 are arranged at positions interposed between the first light emitting layer 30A and the second light emitting layer 30B. A fourth layered portion 60 including one or more p-type nitride semiconductor layers is arranged on the second light emitting layer 30B. A p-side electrode 82 is connected to the fourth layered portion 60. As illustrated in FIG. 5, a method of manufacturing the nitride semiconductor device 2 includes a step S107 of forming the second light emitting layer 30B on or above the third n-type nitride semiconductor layer 53, and a step S108 of forming one or more p-type nitride semiconductor layers on or above the second light emitting layer 30B.

The peak wavelength of light emission of the first light emitting layer 30A and the peak wavelength of light emission of the second light emitting layer 30B may be the same or different. The light emission peak wavelength of the first light emitting layer 30A and the light emission peak wavelength of the second light emitting layer 30B are, for example, 430 nm or more and 540 nm or less. The first and second light emitting layers 30A and 30B emit blue light or green light. By layering the second light emitting layer 30B above the first light emitting layer 30A, the output per unit area can be increased in comparison to a light emitting device including a single light emitting layer.

In a case in which a tunnel junction is used, as in the nitride semiconductor device 1 according to the present embodiment, a nitride semiconductor layer of which the impurity concentration is relatively high is formed. For such a nitride semiconductor layer, because the impurity concentration is high, the flatness tends to deteriorate. Also, because the nitride semiconductor layer is formed after the light emitting layer 30, the nitride semiconductor layer is preferably formed at a low temperature at which the light emitting layer 30 does not deteriorate due to thermal damage, and the flatness tends to deteriorate from this point as well. According to the present embodiment, by forming the second n-type nitride semiconductor layer 52 and the third n-type nitride semiconductor layer 53 subsequent to the first n-type nitride semiconductor layer 51, the flatness of the third n-type nitride semiconductor layer 53 can be enhanced. The second n-type nitride semiconductor layer 52 is formed in a nitrogen atmosphere and the third n-type nitride semiconductor layer 53 is formed in a hydrogen atmosphere. Due to the difference in the atmosphere at the time of formation, the second n-type nitride semiconductor layer 52 undergoes three-dimensional crystal growth, and the third n-type nitride semiconductor layer 53 undergoes crystal growth that promotes lateral growth. By growing the second n-type nitride semiconductor layer 52 on or above the rough morphology of the first n-type nitride semiconductor layer 51, it is presumed that three-dimensional crystal growth is performed on or above an uneven portion of the rough morphology at a finer scale, thereby reducing a large uneven portion. As a result, it is considered that flattening is easily made at the time of performing growth in such a manner that an uneven portion is embedded by the lateral growth by the third n-type nitride semiconductor layer 53 to be subsequently formed. In this manner, by enhancing the flatness of the third n-type nitride semiconductor layer 53, a decrease in the withstand voltage characteristic and the occurrence of leakage caused by deterioration of the flatness of the third n-type nitride semiconductor layer 53 can be suppressed. Thereby, a nitride semiconductor device with enhanced reliability can be obtained.

As an experimental example, up to the third n-type nitride semiconductor layer 53 was formed, the surface was observed by an atomic force microscope (AFM). In the experimental example, a GaN layer having Si doped at a concentration of $1\times10^{20}/cm^3$ was formed with a thickness of 30 nm as the first n-type nitride semiconductor layer 51, a GaN layer having Si doped at a concentration of $5\times10^{18}/cm^3$ was formed with a thickness of 20 nm as the second n-type nitride semiconductor layer 52, and a GaN layer having Si doped at a concentration of $5\times10^{18}/cm^3$ was formed with a thickness of 80 nm as the third n-type nitride semiconductor layer 53. Also, as a comparative example, with the exception of forming a GaN layer doped with Si at a concentration of $5\times10^{18}/cm^3$ at a thickness of 100 nm without forming the second n-type nitride semiconductor layer 52, each nitride semiconductor layer was formed in the same manner as the above described experimental example, and an AFM image of the surface of the Si-doped GaN layer was observed.

Figure 6:
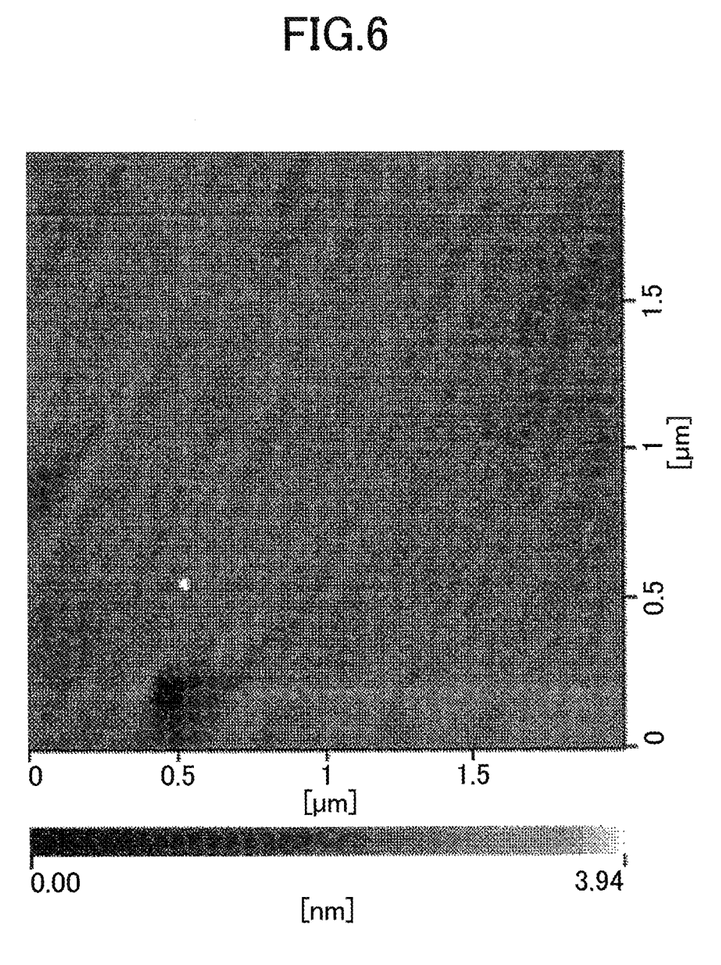
FIG. 6 illustrates an atomic force microscope-taken observation image of an experimental example.
Figure 7:
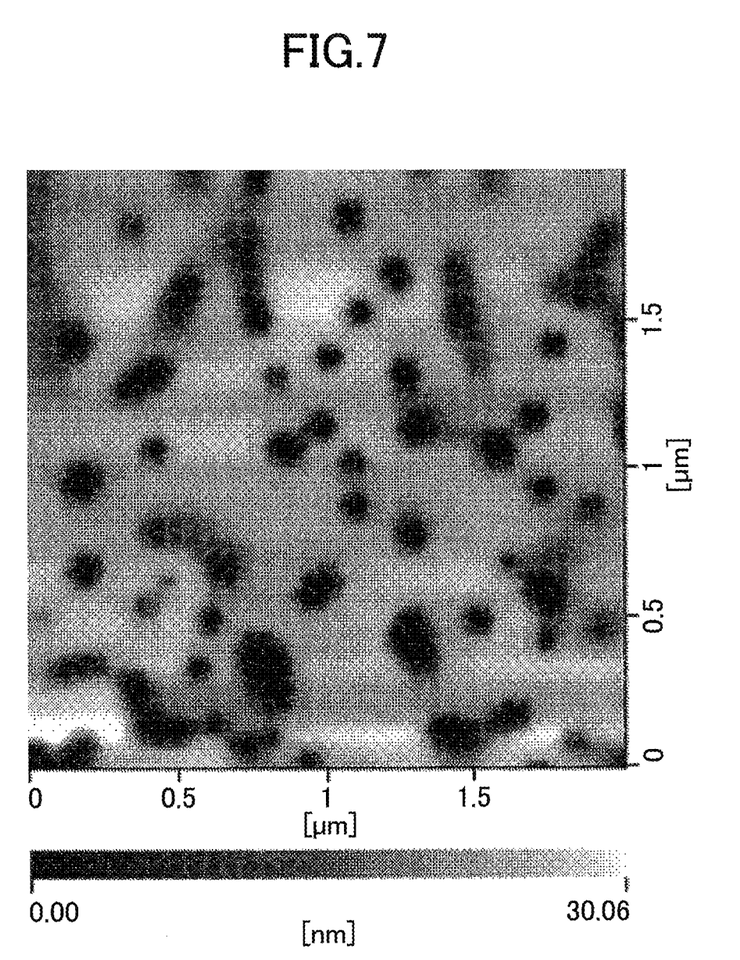
FIG. 7 illustrates an atomic force microscope-taken observation image of a comparative example.

FIG. 6 illustrates an AFM observation image of the experimental example and FIG. 7 illustrates an AFM observation image of the comparative example. Each of FIG. 6 and FIG. 7 is an observation image of a square area having a side of 2.0 μm. As illustrated in FIG. 6 and FIG. 7, the surface state for which the second n-type nitride semiconductor layer 52 was formed had fewer pits. That is, it was found that the flatness of the third n-type nitride semiconductor layer 53 can be enhanced by forming the second n-type nitride semiconductor layer 52. Thus, by enhancing the flatness of the third n-type nitride semiconductor layer 53, a nitride semiconductor device with increased reliability can be obtained.

Embodiments of the present disclosure have been described above with reference to specific examples. However, the present disclosure is not limited to these examples. Any embodiment that can be implemented by a person skilled in the art modifying the above described embodiment of the present disclosure is encompassed by the scope of the present disclosure as long as encompassing the gist of the present disclosure. In addition, within the idea of the present disclosure, a person skilled in the art may come up with various changes and modifications, and it is understood that these changes and modifications also belong to the scope of the present disclosure.

A method of manufacturing a nitride semiconductor device according to the present disclosure can be used in various fields using nitride semiconductor devices such as lighting fixtures, vehicle-mounted lighting, and displays.

What is claimed is:

1. A method of manufacturing a nitride semiconductor device, the method comprising:
   growing, on or above a p-type nitride semiconductor tunnel junction layer, at a first temperature, a first n-type nitride semiconductor layer that forms a tunnel junction with the p-type nitride semiconductor tunnel junction layer, the first n-type nitride semiconductor layer having a first impurity concentration and a first thickness;
   growing, on or above the first n-type nitride semiconductor layer, in a nitrogen atmosphere, at a second temperature, a second n-type nitride semiconductor layer having a second n-type impurity concentration less than the first n-type impurity concentration and a second thickness; and
   growing, on or above the second n-type nitride semiconductor layer, in a hydrogen atmosphere, at a third temperature less than or equal to the first temperature, a third n-type nitride semiconductor layer having a third n-type impurity concentration less than the first n-type impurity concentration and a third thickness.

2. The method according to claim 1, wherein the third thickness is greater than the second thickness.

3. The method according to claim 1, wherein the second thickness is 10 nm or more and the first n-type impurity concentration is $1\times10^{19}/cm^3$ more.

4. The method according to claim 1, wherein each of the second n-type impurity concentration and the third n-type impurity concentration is $1\times10^{18}/cm^3$ or more.

5. The method according to claim 1, wherein a nitride semiconductor constituting the first n-type nitride semiconductor layer and the second n-type nitride semiconductor layer is GaN or AlGaN.

6. The method according to claim 1, wherein the second temperature in growing the second n-type nitride semiconductor layer is less than or equal to the first temperature in growing the first n-type nitride semiconductor layer, and the third temperature in growing the third n-type nitride semiconductor layer is equal to or higher than the second temperature in growing the second n-type nitride semiconductor layer.

7. The method according to claim 1, further comprising, prior to growing the first n-type nitride semiconductor layer:
   growing one or more n-type nitride semiconductor layers on or above a substrate;
   growing a light emitting layer on or above the one or more n-type nitride semiconductor layers; and
   growing the p-type nitride semiconductor tunnel junction layer on or above the light emitting layer.

8. The method according to claim 7,
   wherein the light emitting layer is a first light emitting layer,
   wherein the method comprises, after the growing of the third n-type nitride semiconductor layer:
   growing a second light emitting layer on or above the third n-type nitride semiconductor layer; and
   growing one or more p-type nitride semiconductor layers on or above the second light emitting layer.

9. The method according to claim 1, wherein the first n-type nitride semiconductor layer is grown in contact with the p-type nitride semiconductor tunnel junction layer.

10. The method according to claim 1, wherein a nitride semiconductor constituting the p-type nitride semiconductor tunnel junction layer is GaN, InGaN, or AlGaN.

11. The method according to claim 1, wherein the third thickness is greater than the first thickness.

12. A method of manufacturing a nitride semiconductor device, the method comprising:
   growing one or more n-type nitride semiconductor layers on or above a substrate;
   growing a first light emitting layer on or above the one or more n-type nitride semiconductor layers;
   growing, on or above the first light emitting layer, a p-type nitride semiconductor tunnel junction layer having a p-type impurity concentration of $5\times10^{19}/cm^3$ or more and $1\times10^{21}/cm^3$ or less and a thickness of 2 nm or more and 30 nm or less;
   growing, on the p-type nitride semiconductor tunnel junction layer, at a first temperature, a first n-type nitride semiconductor layer having a first impurity concentration of $1\times10^{19}/cm^3$ or more and a first thickness of 2 nm or more and 30 nm or less;
   growing, on or above the first n-type nitride semiconductor layer, in a nitrogen atmosphere, at a second temperature, a second n-type nitride semiconductor layer having a second n-type impurity concentration less than the first n-type impurity concentration and a second thickness;
   growing, on or above the second n-type nitride semiconductor layer, in a hydrogen atmosphere, at a third temperature less than or equal to the first temperature, a third n-type nitride semiconductor layer having a third n-type impurity concentration less than the first n-type impurity concentration and a third thickness;
   growing a second light emitting layer on or above the third n-type nitride semiconductor layer; and
   growing one or more p-type nitride semiconductor layers on or above the second light emitting layer.

13. The method according to claim 12, wherein the third thickness is greater than the second thickness.

14. The method according to claim 12, wherein the second thickness is 10 nm or more.

15. The method according to claim 12, wherein each of the second n-type impurity concentration and the third n-type impurity concentration is $1\times10^{18}/cm^3$ or more.

16. The method according to claim 12, wherein a nitride semiconductor constituting the first n-type nitride semiconductor layer and the second n-type nitride semiconductor layer is GaN or AlGaN.

17. The method according to claim 12, wherein a nitride semiconductor constituting the p-type nitride semiconductor tunnel junction layer is GaN, InGaN, or AlGaN.

18. The method according to claim 12, wherein each of the first light emitting layer and the second light emitting layer is configured to emit light having a peak wavelength of 430 nm or more and 540 nm or less.

* * * * *